(12) United States Patent
Toyoda et al.

(10) Patent No.: US 6,661,225 B2
(45) Date of Patent: Dec. 9, 2003

(54) REVOLUTION DETECTING DEVICE

(75) Inventors: Inao Toyoda, Anjo (JP); Yasutoshi Suzuki, Aichi-ken (JP); Yuichiro Murata, Nagoya (JP); Hirofumi Uenoyama, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/348,187

(22) Filed: Jan. 22, 2003

(65) Prior Publication Data

US 2003/0137381 A1 Jul. 24, 2003

(30) Foreign Application Priority Data

Jan. 23, 2002 (JP) ........................................ 2002-013996

(51) Int. Cl.$^7$ .............................................. G11B 5/147
(52) U.S. Cl. ................................... 324/252; 324/207.21
(58) Field of Search ............................ 324/252, 207.21; 360/324–324.12; 365/158

(56) References Cited

U.S. PATENT DOCUMENTS 6,580,270 B1 * 6/2003 Coehoorn ................... 324/252

FOREIGN PATENT DOCUMENTS

| JP | 8-70148 | 3/1996 |
| JP | 8-70149 | 3/1996 |
| JP | 11-108689 | 4/1999 |
| JP | 2000-123328 | 4/2000 |
| JP | 2000-304568 | 11/2000 |

* cited by examiner

Primary Examiner—Ramon M. Barrera
(74) Attorney, Agent, or Firm—Posz & Bethards, PLC

(57) ABSTRACT

In a revolution detecting device, a tunneling magnetoresistance sensor having an element located in a region is provided. The tunneling magnetoresistance sensor comprises a substrate, a pinned layer composed of ferromagnetism material and located to one side of the substrate, a tunneling layer composed of insulating film and located to one side of the pinned layer and a free layer composed of ferromagnetism film and located to one side of the tunneling layer. The element is configured to detect a change of magnetoresistance of the element according to a magnetic field applied in the region in which the element is located. The change of the magnetoresistance of the element is based on a change of current flowing through the tunneling layer between the pinned layer and the free layer. In the revolution detecting device, a revolution member is disposed in a vicinity of the element in the Y axis from a viewpoint of the element. The revolution member has a surface portion opposite to the element. The surface portion is formed with S poles and N poles which are alternately arranged. In the revolution detecting device, a magnet is disposed in a vicinity of the element and generating the magnetic field and a direction of the magnetic field is substantially parallel to the Y axis at a center portion of the element. When the revolution member revolves, the S poles and N poles are configured to move substantially in parallel to the X axis on the Y axis determined by the element.

12 Claims, 7 Drawing Sheets

REVOLUTION DETECTING DEVICE

BACKGROUND OF THE INVENTION

1. Field of the Invention

The present invention relates to a revolution detecting device using a tunneling magnetoresistance sensor (TMR sensor).

2. Description of the Related Art

As a revolution detecting device used in wheel speed sensors for vehicles or the like, an MR element (magnetoresistance element) or the like are used. The MR element has low magnetoresistance (MR) ratio (magnetoresistance change) of approximately 3% so that the detection signals of the MR element are weak.

Therefore, it is necessary for an amplifier to amplify the detection signals. A large gain of the amplifier is required for amplifying the weaken detection signals of the MR element. Due to the large gain of the amplifier, error component included in the detection signals are large so that an error correction circuit with large-scale must be required for correcting the error component included in the detection signals of the MR element.

In order to solve the above problems, revolution detecting devices each having a TMR sensor with a high MR ratio, such as 18% and over at room temperature, compared with the MR ratio of the MR element are disclosed in many Japanese Patent Publications of No. 8-70148, No. 11108689, No. 2000-304568, 2000-123328 and so on.

The TMR sensor comprises an element which is formed with a pinned layer composed of ferromagnetic material formed on a substrate, a tunneling film (tunneling layer) composed of insulating film and a free layer composed of ferromagnetic material. When the TMR sensor is located in a magnetic field, tunneling current between the pinned layer and the free layer via the tunneling film varies according to the change of magnetic field so that the change of the tunneling current allows change of magnetoresistance of the element to be detected.

Concretely, when discotic magnetic rotor with a circumferential side surface which is magnetized so that S poles and N poles are alternately arranged in the circumferential direction thereof is revolved, a number of changes of the magnetic field caused by the revolution of the rotor is detected by the TMR sensor, making it possible to obtain a number of revolutions of the rotor. In this case, the detected number of revolutions includes not only a plurality of revolutions but also a revolution less than one revolution, such as a half revolution.

However, the revolution detecting device using the TMR sensor is still developing so as to leave room for many improvements.

SUMMARY OF THE INVENTION

The invention is made on the background of the need of the related arts.

Accordingly, it is an object of the invention to provide a revolution detecting device having a TMR sensor and capable of efficiently detecting a change of sensitivity of the TMR sensor.

In order to achieve the object, inventors performed considerations as follows.

That is, a magnetic field applied in a region in which an element of a tunneling magnetoresistance sensor (TMR sensor) is located allows a magnetization direction of a free layer of an element of the TMR sensor to be changed with respect to the magnetization direction of a pinned layer of the element, causing a change of a magnetoresistance of the element.

Then, when Cartesian coordinate system is determined such that a center of the free layer of the element is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis.

In Cartesian coordinate system, changes of the magnetoresistance, that is, changes of MR ratio of the element with respect to revolutions of the magnetic field in planes of X-Y plane including the X axis and the Y axis, X-Z plane including the X axis and the Z axis and Y-Z plane including the Y axis and the Z axis were examined, wherein the magnetic field is applied to the region in which the element is located.

FIGS. 1 to 3 represent the results of the changes of magnetoresistance.

FIG. 1 is a view showing a relationship between an angle θ of a direction of the magnetic field with respect to the X axis and the change of magnetoresistance of the element when the magnetic field revolves around the Z axis in the X-Y plane, FIG. 2 is a view showing a relationship between an angle θ of a direction of the magnetic field with respect to the X axis and the change of magnetoresistance of the element when the magnetic field revolves around the Y axis in the X-Z plane and FIG. 3 is a view showing a relationship between an angle θ of a direction of the magnetic field with respect to the Y axis and the change of magnetoresistance of the element when the magnetic field revolves around the X axis in the Y-Z plane.

In each of FIGS. 1 to 3, each ratio between each of the maximum values of each magnetoresistance and each of the minimum values thereof substantially corresponds to an MR ratio.

In FIG. 1, using a range of region A in which the magnetoresistance rapidly changes allows grate change of the magnetoresistance to be detected. That is, it is possible to detect the change of magnetoresistance at high sensitivity when the magnetic field pivotally changes with respect to the Y axis in parallel to the X-Y plane.

In FIG. 2, using a range of region B in which the magnetoresistance rapidly changes allows grate change of the magnetoresistance to be detected. That is, it is possible to detect the change of magnetoresistance at high sensitivity when the magnetic field pivotally changes with respect to the Z axis in parallel to the X-Z plane.

In other words, each of the regions A and B is a range such that the MR ratio is mostly changed according to the change of the magnetic field. Incidentally, in FIG. 3, no change of the magnetization direction of the free layer occurs so that, in FIG. 3, the magnetoresistance of the element is constant irrespective of the change of the magnetic field.

That is, using characteristics of the elements of the TMR sensor shown in FIGS. 1 and 2 to contrive a positional relationship between the revolution member and the element allows the change of sensitivity of the element to be efficiently detected.

According to one aspect of the present invention, there is provided a revolution detecting device comprising: a tunneling magnetoresistance sensor having an element located in a region, the element comprising: a substrate; a pinned layer composed of ferromagnetism material and located to one side of the substrate; a tunneling layer composed of insulating film and located to one side of the pinned layer; and a free layer composed of ferromagnetism film and located to one side of the tunneling layer, the element being configured to detect a change of magnetoresistance of the element according to a magnetic field applied in the region in which the element is located, the change of the magnetoresistance of the element being based on a change of current flowing through the tunneling layer between the pinned layer and the free layer; when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Y axis from a viewpoint of the element, the revolution member having a surface portion opposite to the element, the surface portion being formed with S poles and N poles which are alternately arranged; and a magnet disposed in a vicinity of the element and generating the magnetic field, a direction of the magnetic field being substantially parallel to the Y axis at a center portion of the element, wherein, when the revolution member revolves, the S poles and N poles are configured to move substantially in parallel to the X axis on the Y axis determined by the element.

In the one aspect of the invention, because the S poles and N poles are configured to move substantially in parallel to the X axis on the Y axis determined by the element, the magnetic field whose direction is substantially parallel to the Y axis direction at the center portion of the element, pivotally changes with respect to the Y axis in the plane parallel to the X-Y plane.

The pivotally change of the magnetic field makes change the tunneling current of the TMR sensor so that obtaining the number of changes of the tunneling current of the TMR sensor allows the number of revolutions of the revolution member to be detected.

That is, in the one aspect of the invention, using the range of region A shown in FIG. 1 in which the magnetoresistance rapidly changes allows the magnetoresistance to be detected at high sensitivity so that it is possible to provide the revolution detecting device having the TMR sensor with a high MR ratio and capable of efficiently detecting the change of sensitivity of the TMR sensor.

According to another aspect of the present invention, there is provided a revolution detecting device comprising: a tunneling magnetoresistance sensor having an element located in a region, the element comprising: a substrate; a pinned layer composed of ferromagnetism material and located to one side of the substrate; a tunneling layer composed of insulating film and located to one side of the pinned layer; and a free layer composed of ferromagnetism film and located to one side of the tunneling layer, the element being configured to detect a change of magnetoresistance of the element according to a magnetic field applied in the region in which the element is located, the change of the magnetoresistance of the element being based on a change of current flowing through the tunneling layer between the pinned layer and the free layer; when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Y axis from a viewpoint of the element, the revolution member having a surface portion opposite to the element, the surface portion being formed with projecting portions and concave portions which are alternately arranged; and a magnet disposed in a vicinity of the element and generating the magnetic field, a direction of the magnetic field being substantially parallel to the Y axis at a center portion of the element, wherein, when the revolution member revolves, the projecting portions and concave portions are configured to move substantially in parallel to the X axis on the Y axis determined by the element.

In the another aspect of the invention, because the projection portions and the concave portions are configured to move substantially in parallel to the X axis on the Y axis determined by the element, the magnetic field whose direction is substantially parallel to the Y axis direction at the center portion of the element, pivotally changes with respect to the Y axis in the plane parallel to the X-Y plane.

The pivotally change of the magnetic field makes change the tunneling current of the TMR sensor so that obtaining the number of changes of the tunneling current of the TMR sensor allows the number of revolutions of the revolution member to be detected.

That is, in the another aspect of the invention, using the range of region A shown in FIG. 1 in which the magnetoresistance rapidly changes allows the magnetoresistance to be detected at high sensitivity so that it is possible to provide the revolution detecting device having the TMR sensor with a high MR ratio and capable of efficiently detecting the change of sensitivity of the TMR sensor.

According to further aspect of the present invention, there is provided a revolution detecting device comprising: a tunneling magnetoresistance sensor having an element located in a region, the element comprising: a substrate; a pinned layer composed of ferromagnetism material and located to one side of the substrate; a tunneling layer composed of insulating film and located to one side of the pinned layer; and a free layer composed of ferromagnetism film and located to one side of the tunneling layer, the element being configured to detect a change of magnetoresistance of the element according to a magnetic field applied in the region in which the element is located, the change of the magnetoresistance of the element being based on a change of current flowing through the tunneling layer between the pinned layer and the free layer; when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Z axis from a viewpoint of the element, the revolution member having a surface portion opposite to the element, the surface portion being formed with S poles and N poles which are alternately arranged; and a magnet disposed in a vicinity of the element and generating the magnetic field, a direction of the magnetic field being substantially parallel to the Z axis at a center portion of the element, wherein, when the revolution member revolves, the S poles and N poles are configured to move substantially in parallel to the X axis on the Z axis determined by the element.

In the further aspect of the invention, as compared to the one aspect of the invention, the revolution member is disposed in the vicinity of the element in the Z axis from the viewpoint of the element, and the magnet is disposed in the vicinity of the element and generates the magnetic field so that the direction of the magnetic field is substantially parallel to the Z axis at the center portion of the element. When the revolution member revolves, the S poles and N poles are configured to move substantially in parallel to the X axis on the Z axis determined by the element.

That is, in the further aspect of the invention, because the S poles and the N poles are configured to move substantially in parallel to the X axis on the Z axis determined by the element, the magnetic field whose direction is substantially parallel to the Z axis direction at the center portion of the element, pivotally changes with respect to the Z axis in the plane parallel to the X-Z plane.

The pivotally change of the magnetic field makes change the tunneling current of the TMR sensor so that obtaining the number of changes of the tunneling current of the TMR sensor allows the number of revolutions of the revolution member to be detected.

That is, in the further aspect of the invention, using the range of region B shown in FIG. 2 in which the magnetoresistance rapidly changes allows the magnetoresistance to be detected at high sensitivity so that it is possible to provide the revolution detecting device having the TMR sensor with a high MR ratio and capable of efficiently detecting the change of sensitivity of the TMR sensor.

According to still further aspect of the present invention, there is provided a revolution detecting device comprising: a tunneling magnetoresistance sensor having an element located in a region, the element comprising; a substrate; a pinned layer composed of ferromagnetism material and located to one side of the substrate; a tunneling layer composed of insulating film and located to one side of the pinned layer; and a free layer composed of ferromagnetism film and located to one side of the tunneling layer, the element being configured to detect a change of magnetoresistance of the element according to a magnetic field applied in the region in which the element is located, the change of the magnetoresistance of the element being based on a change of current flowing through the tunneling layer between the pinned layer and the free layer; when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Z axis from a viewpoint of the element, the revolution member having a surface portion opposite to the element, the surface portion being formed with projecting portions and concave portions which are alternately arranged; and a magnet disposed in a vicinity of the element and generating the magnetic field, a direction of the magnetic field being substantially parallel to the Z axis at a center portion of the element, wherein, when the revolution member revolves, the projecting portions and concave portions are configured to move substantially in parallel to the X axis on the Z axis determined by the element.

In the still further aspect of the invention, as compared to the another aspect of the invention, the revolution member is disposed in the vicinity of the element in the Z axis from the viewpoint of the element, and the magnet is disposed in the vicinity of the element and generates the magnetic field so that the direction of the magnetic field is substantially parallel to the Z axis at the center portion of the element. When the revolution member revolves, the projection portions and the concave portions are configured to move substantially in parallel to the X axis on the Z axis determined by the element.

That is, in the still further aspect of the invention, because the projection portions and the concave portions are configured to move substantially in parallel to the X axis on the Z axis determined by the element, the magnetic field whose direction is substantially parallel to the Z axis direction at the center portion of the element, pivotally changes with respect to the Z axis in the plane parallel to the X-Z plane.

The pivotally change of the magnetic field makes change the tunneling current of the TMR sensor so that obtaining the number of changes of the tunneling current of the TMR sensor allows the number of revolutions of the revolution member to be detected.

That is, in the still further aspect of the invention, using the range of region B shown in FIG. 2 in which the magnetoresistance rapidly changes allows the magnetoresistance to be detected at high sensitivity so that it is possible to provide the revolution detecting device having the TMR sensor with a high MR ratio and capable of efficiently detecting the change of sensitivity of the TMR sensor.

According to still further aspect of the present invention, there is provided a revolution detecting device comprising: a tunneling magnetoresistance sensor having an element located in a region, the element comprising: a substrate; a pinned layer composed of ferromagnetism material and located to one side of the substrate; a tunneling layer composed of insulating film and located to one side of the pinned layer; and a free layer composed of ferromagnetism film and located to one side of the tunneling layer, the element being configured to detect a change of magnetoresistance of the element according to a magnetic field applied in the region in which the element is located, the change of the magnetoresistance of the element being based on a change of current flowing through the tunneling layer between the pinned layer and the free layer; and when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Y axis from a viewpoint of the element, the revolution member having a surface portion opposite to the element, the surface portion being formed with S poles and N poles which are alternately arranged, wherein, when the revolution member revolves, the S poles and N poles are configured to move substantially in parallel to the X axis on the Y axis determined by the element.

In the still further aspect of the invention, because the S poles and the N poles are configured to move substantially in parallel to the X axis on the Y axis determined by the element, the magnetic field generated by the S poles and the N at the center portion of the element pivotally changes in the plane parallel to the X-Y plane.

The pivotally change of the magnetic field makes change the tunneling current of the TMR sensor so that obtaining the number of changes of the tunneling current of the TMR sensor allows the number of revolutions of the revolution member to be detected.

That is, in the still further aspect of the invention, using the range of region A shown in FIG. 1 in which the magnetoresistance rapidly changes allows the magnetoresistance to be detected at high sensitivity so that it is possible to provide the revolution detecting device having the TMR sensor with a high MR ratio and capable of efficiently detecting the change of sensitivity of the TMR sensor.

According to still further aspect of the present invention, there is provided a revolution detecting device comprising: a tunneling magnetoresistance sensor having an element located in a region, the element comprising: a substrate; a pinned layer composed of ferromagnetism material and located to one side of the substrate; a tunneling layer composed of insulating film and located to one side of the pinned layer; and a free layer composed of ferromagnetism film and located to one side of the tunneling layer, the element being configured to detect a change of magnetoresistance of the element according to a magnetic field applied to the element, the change of the magnetoresistance of the element being based on a change of current flowing through the tunneling layer between the pinned layer and the free layer; and when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Z axis from a viewpoint of the element, the revolution member having a surface portion opposite to the element, the surface portion being formed with S poles and N poles which are alternately arranged, wherein, when the revolution member revolves, the S poles and N poles are configured to move substantially in parallel to the X axis on the Z axis determined by the element.

In the still further aspect of the invention, because the S poles and the N poles are configured to move substantially in parallel to the X axis on the Z axis determined by the element, the magnetic field generated by the S poles and the N at the center portion of the element pivotally changes in the plane parallel to the X-Z plane.

The pivotally change of the magnetic field makes change the tunneling current of the TMR sensor so that obtaining the number of changes of the tunneling current of the TMR sensor allows the number of revolutions of the revolution member to be detected.

That is, in the still further aspect of the invention, using the range of region B shown in FIG. 2 in which the magnetoresistance rapidly changes allows the magnetoresistance to be detected at high sensitivity so that it is possible to provide the revolution detecting device having the TMR sensor with a high MR ratio and capable of efficiently detecting the change of sensitivity of the TMR sensor.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the invention will be described hereinafter with reference to the accompanying drawings.

(First embodiment)

Figure 4A:
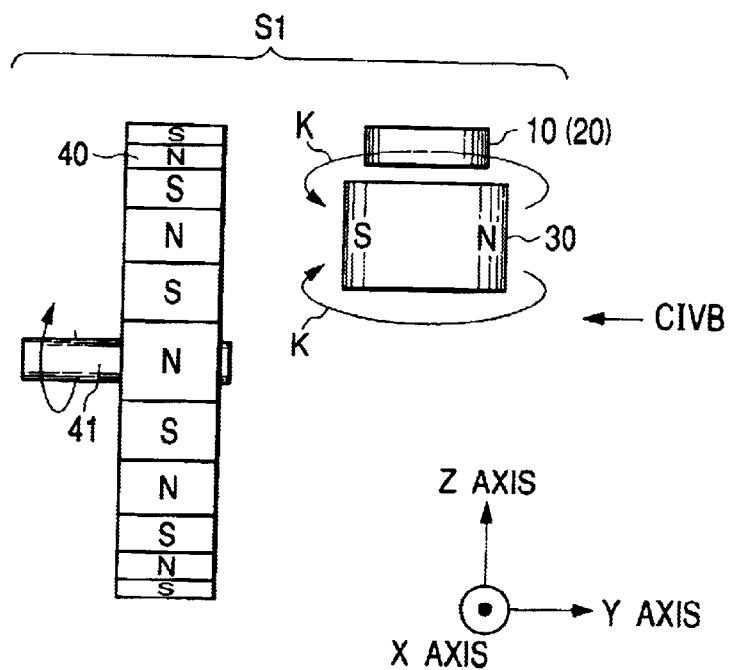
FIG. 4A is a view showing a structure of a revolution detecting device according to a first embodiment of the invention.
Figure 4B:
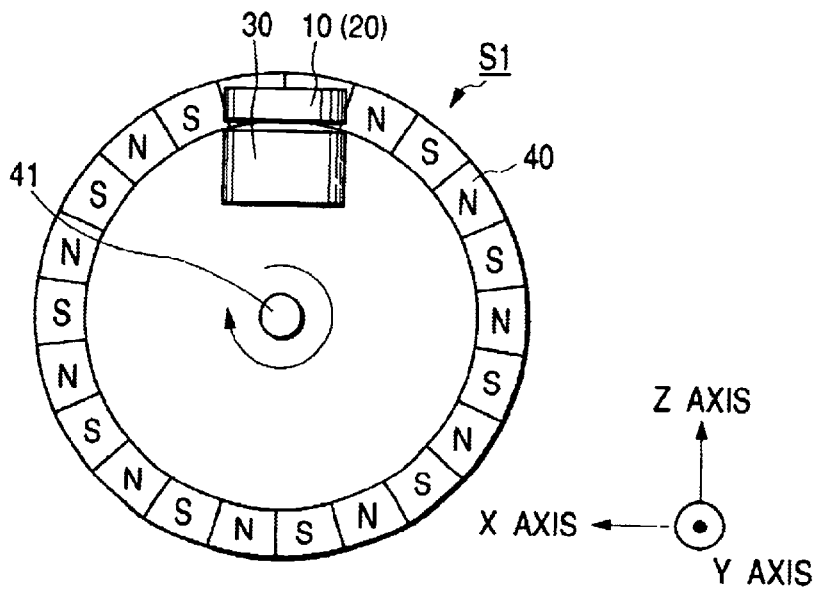
FIG. 4B is a view showing the revolution detecting device on arrow IB shown in FIG. 4A.

FIG. 4A is a view showing a structure of a revolution detecting device S1 according to a first embodiment of the invention, and FIG. 4B is a view showing the revolution detecting device S1 on arrow IVB.

As shown in FIGS. 4A and 4B, the revolution detecting device S1 comprises a tunneling magnetoresistance sensor (TMR sensor) 10 with an element 20 having a laminated structure, a magnet 30 disposed in the vicinity of the TMR sensor 10, and a discotic magnetic rotor 40.

Figure 5:
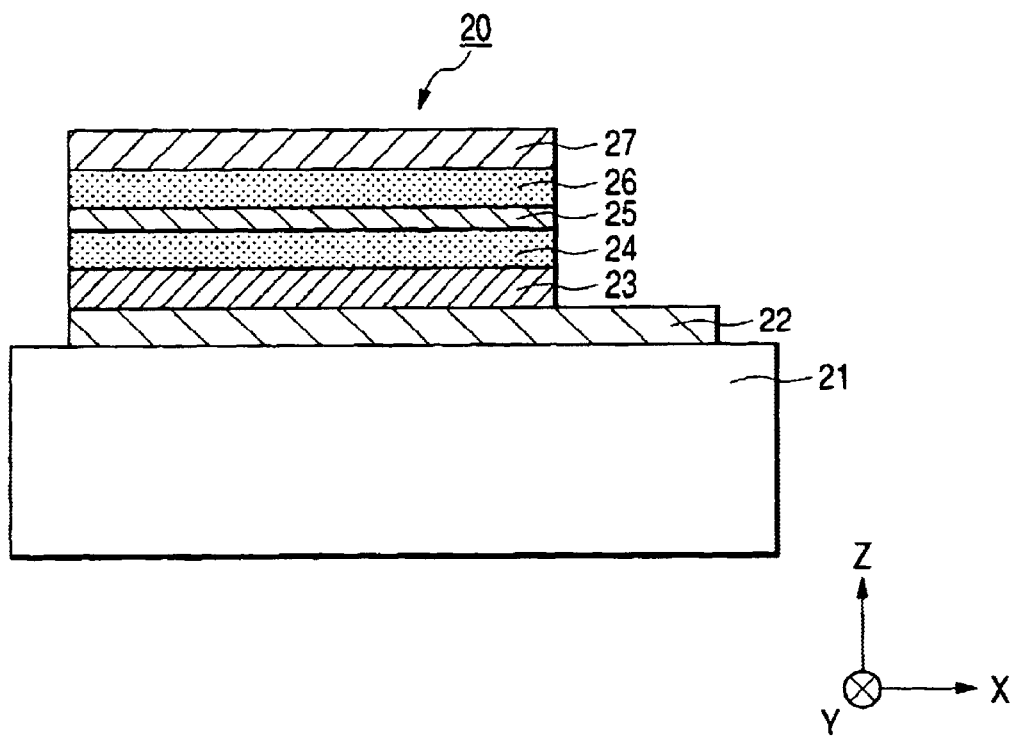
FIG. 5 is a cross sectional view of an element of a TMR sensor taken on its laminating direction according to the first embodiment of the invention.

FIG. 5 is a cross sectional view of the element 20 of the TMR sensor 10 taken on its laminating direction according to the first embodiment of the invention.

As shown in FIG. 5, the element 20 of the TMR sensor 10 comprises a substrate 21 composed of, for example, silicon substrate or the like, a bottom electrode 22 laminated on the substrate 21, a pining layer 23 composed of antiferromagnetism film and laminated on the bottom electrode 22, a pinned layer 24 composed of ferromagnetism film and laminated on the pinning layer 23, a tunneling layer (tunneling film) 25 composed of insulating film and laminated on the pinned layer 24, a free layer 26 composed of ferromagnetism film and laminated on the tunneling film 25, and a top electrode 27 laminated on the free layer 26.

Each of the bottom and top electrodes 22 and 27 is composed of electrode material such as platinum (Pt) or the like. The pinning layer 23 is composed of antiferromagnetism material such as Fe—Mn (ferromanganese alloy) or the like. The pinned layer 24 and free layer 26 are composed of ferromagnetism material such as Ni—Fe (ferronickel alloy) or the like, and the tunneling film 25 is composed of insulative and nonmagnetic material such as alumina or the like.

The element 20 which has the above laminated structure has a high MR ratio and can be manufactured in usual file forming methods such as sputter, deposition or the like.

The pinning layer 23 is configured to pin the magnetization direction of the pinned layer 24 not to be reversed, and an exterior magnetic field applied in a region in which the element 20 is located allows the magnetization direction of the free layer 26 to be reversible.

In the element 20, tunneling current flows through the tunneling layer 25 between the pinned layer 24 and the free layer 26. When the exterior magnetic field changes, the magnetization direction of the pinned layer 24 is pinned to be constant, but the magnetization direction of the free layer 26 changes due to the change of the exterior magnetic field so that the resistance (magnetoresistance) between the top and bottom electrodes 22 and 27 changes, causing the tunneling current to vary.

Incidentally, the structure of the element 20 is not limited to that shown in FIG. 5. That is, an element of a TMR sensor according to the invention may comprise the pinned layer composed of ferromagnetism material and mounted on the substrate, the free layer composed of ferromagnetism material and the tunneling firm composed of insulating film interposed between the pinned layer and the free layer, and may be configured to detect a change of its magnetoresistance according to the change of tunneling current flowing through the tunneling film between the pinned layer and the free layer due to the change of the exterior magnetic field being applied to the element. Therefore, TMR elements disclosed in the above Patent Publications in the related art may be used as the element 20 of the TMR sensor 10.

Then, X, Y and Z axes are determined so that a center of the free layer 26 is taken as the origin, the magnetization direction of the pinned layer 24 passing through the origin is taken as the X axis, the direction passing through the origin and orthogonal to the X axis and a layer plane of the pinned layer 24 is taken as the Z axis and the direction passing through the origin and orthogonal to an X-Z plane including the X axis and the Z axis is taken as the Y axis. That is, the X, Y and Z axes constitutes Cartesian coordinate system.

Figure 1:
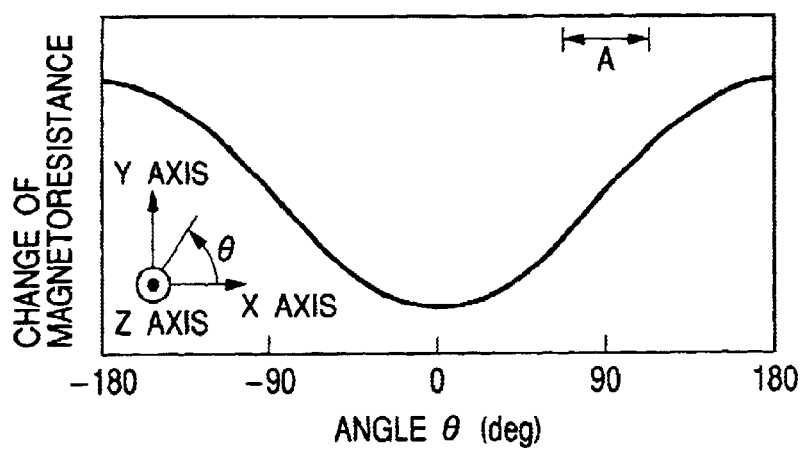
FIG. 1 is a view showing a relationship between an angle θ of a direction of a magnetic field with respect to an X axis and a change of magnetoresistance of the element when the magnetic field revolves around a Z axis in an X-Y plane according to the invention.
Figure 2:
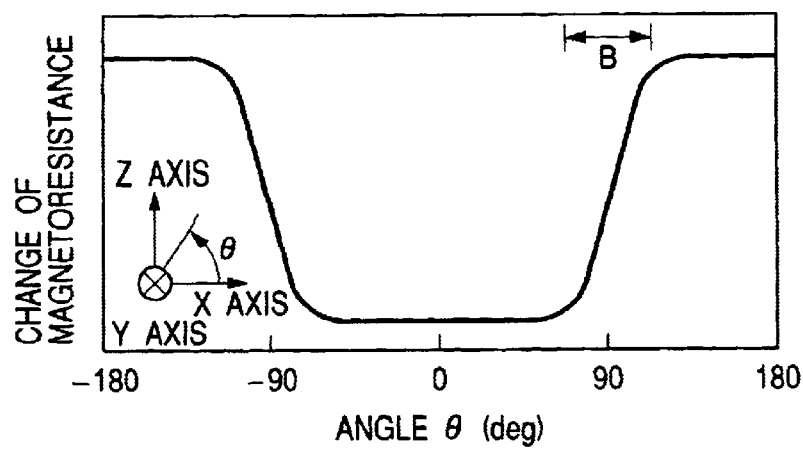
FIG. 2 is a view showing a relationship between an angle θ of a direction of a magnetic field with respect to an X axis and a change of magnetoresistance of the element when the magnetic field revolves around a Y axis in an X-Z plane according to the invention.
Figure 3:
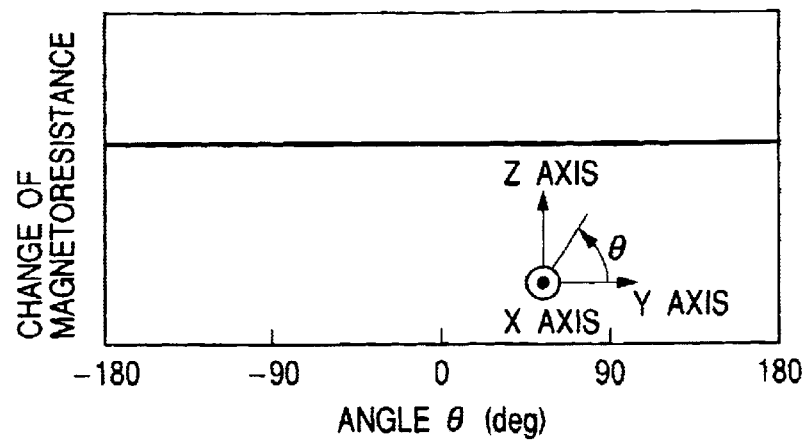
FIG. 3 is a view showing a relationship between an angle θ of a direction of a magnetic field with respect to a Y axis and a change of magnetoresistance of the element when the magnetic field revolves around an X axis in a Y-Z plane according to the invention.

In the Cartesian coordinate system, characteristics of changes in magnetoresistance of the element 20 are shown in FIGS. 1 to 3. That is, as shown in FIG. 1, when the exterior magnetic field rotates around the Z axis in the X-Y plane, using a range of region A in which magnetoresistance rapidly changes, that is, a range that the direction of the exterior magnetic field pivotally changes with respect to the Y axis ($\theta=90°$ in FIG. 1) allows the magnetoresistance to be detected at high sensitivity.

In addition, as shown in FIG. 2, when the exterior magnetic field rotates around the Y axis in the X-Z plane, using a range of region B in which magnetoresistance rapidly changes, that is, a range that the direction of the exterior magnetic field pivotally changes with respect to the Z axis ($\theta=90°$ in FIG. 2) allows magnetoresistance to be detected at high sensitivity.

As shown in FIGS. 4A and 4B, the magnetic rotor 40 is disposed in the vicinity of the element 20 of the TMR sensor 10 in the Y direction from the viewpoint of the element 20.

That is, the magnetic rotor 40 is composed of discotic magnetic material, and has first and second circular surfaces opposite to each other and a circumferential side surface connected to the first and second circular surfaces. The circumferential side surface of the magnetic rotor 40 is magnetized so that S poles and N poles are alternately formed to be arranged in the circumferential direction thereof.

The magnetic rotor 40 is provided at its center portion with a rotor shaft 41 to be rotatable therewith. That is, the rotor shaft 41 is joined to a shaft such as a wheel shaft or the like. The rotor shaft 41 rotates with the wheel shaft or the like, making the magnetic rotor 40 revolve.

The element 20 is arranged to be opposite to a part of one of the first and second circular surfaces of the magnetic rotor 40, and the magnetic rotor 40 is arranged so that a tangential line of the opposite part of the circumferential side surface of the rotor 40 substantially equals to the Y axis of the element 20 of the TMR sensor 10.

When the magnetic rotor 40 revolves, the S poles and N poles of the magnetic rotor 40 are configured to move substantially in parallel to the X axis on the Y axis of the element 20. That is, assuming that the Y axis extends from the center of the element 20 toward the magnetic rotor 40, on the extent Y axis, the S poles and N poles of the magnetic rotor 40 are configured to move substantially in parallel to the X axis.

Incidentally, as shown in FIGS. 4A and 4B, the magnet 30 has, for example, a substantially rectangular solid shape, one lateral end portion of which is S pole and other end portion of which is N pole. The magnet 30 is disposed in the vicinity of the element 20 to be arranged at a distance away from the element 20, distance which is shorter than a distance between the element 20 and the magnet 30. The magnet 30 is arranged so that the one end portion (S pole side) of the magnet 30 is opposite to the one of the first and second circular surfaces of the magnetic rotor 40 and the direction of the magnetic field K generated from the N pole to the S pole of the magnet 30 is substantially parallel to the Y axis at the center portion of the element 20.

The magnet 30 and the element 20 of the TMR sensor 10 are molded to be integrated with each other by resin so that the molded integration of magnet 30 and the element 20 of the TMR sensor 10 can be disposed to a predetermined position in the revolution detecting device S1.

Next, operations of the revolution detecting device S1 having the above structure will be described hereinafter.

The revolution detecting device S1 is configured to detect a number of revolutions of the magnetic rotor 40 which revolves with the revolution of the wheel or the like. Incidentally, the detected number of revolutions includes not only a plurality of revolutions but also a revolution less than one revolution, such as a half revolution.

As shown in FIGS. 4A and 4B, when the magnetic rotor 40 is at a standstill as an initial stage, the magnetic field in the region at which the element 20 is located corresponds to the magnetic field K generated by the magnet 30, and the direction of the vector of the magnetic field K is substantially parallel to the Y axis direction at the center portion of the element 20, that is, as shown in FIG. 1, the angle θ between the direction of the vector of the magnetic field K and the X axis becomes substantially 90°.

When the magnetic rotor 40 revolves together with the rotor shaft 41, the S poles and the N poles of the magnetic rotor 40 move on the Y axis of the element 20 in substantially parallel to the X axis so that the movements of the S poles and N poles of the magnetic rotor 40 affect the magnetic field K, causing the direction of the vector of the magnetic field K to pivotally change in the range of region A shown in FIG. 1 with respect to the Y axis (θ=90°) in a plane parallel to the X-Y plane, thereby changing the angle θ between the direction of the vector of the magnetic field K and the X axis, as shown in FIG. 1.

The change of the angle θ between the vector of the magnetic field K and the X axis makes change the tunneling current of the TMR sensor 10 so that obtaining the number of changes of the tunneling current of the TMR sensor 10 allows the number of revolutions of the magnetic rotor 40 to be detected.

According to the first embodiment of the invention, using the range of region A shown in FIG. 1 in which the magnetoresistance rapidly changes allows the magnetoresistance to be detected at high sensitivity so that it is possible to provide the revolution detecting device S1 having the TMR sensor 10 with a high MR ratio and capable of efficiently detecting a change of sensitivity of the TMR sensor 10.

Figure 6:
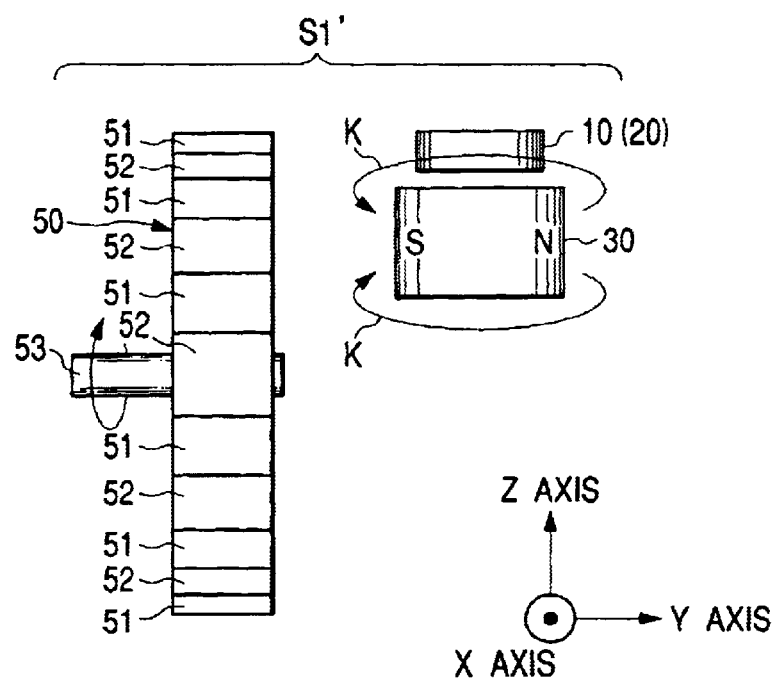
FIG. 6 is a view showing a structure of a revolution detecting device according to a modification of the first embodiment.

Next, a revolution detecting device S1a as a modification of the revolution detecting device S1 according to the first embodiment is shown in FIG. 6. The revolution detecting device S1a according to the modification comprises a discotic gear 50 in place of the magnetic rotor 40. The gear 50 has first and second circular surfaces opposite to each other and a circumferential side surface connected to the first and second circular surfaces. The circumferential side surface of the gear 50 is formed its circumferential side surface with projection portions (teeth) 51 and concave portions 52 that are alternately arranged in the circumferential direction.

The gear 50 is disposed in the vicinity of the element 20 of the TMR sensor 10 in the Y direction from the viewpoint of the element 20. The gear 50 is provided at its center portion with a gear shaft 53 to be rotatable therewith. That is, the gear shaft 53 is joined to a shaft such as a wheel shaft or the like. The gear shaft 53 rotates with the wheel shaft or the like, making the gear 50 revolve.

The gear 50 is arranged so that a tangential line of one end of the circumferential side surface of the gear 50 substantially equals to the Y axis of the element 20 of the TMR sensor 10.

When the gear 50 revolves, the projection portions 51 and the concave portions 52 of the gear 50 are configured to move substantially in parallel to the X axis on the Y axis of the element 20. That is, assuming that the Y axis extends from the center of the element 20 toward the magnetic rotor 40, on the extent Y axis, the projection portions 51 and the concave portions 52 of the gear 50 are configured to move substantially in parallel to the X axis.

Other elements of the revolution detecting device S1a according to the modification are substantially the same of the revolution detecting device S1 according to the first embodiment.

In the revolution detecting device S1a, when the gear 50 revolves together with the gear shaft 51, the projection portions 51 and the concave portions 52 of the gear 50 move on the Y axis of the element 20 in substantially parallel to the X axis so that the points of time at which the projection portions (teeth) 51 of the gear 50 are opposite to the magnet 30 and the points of time at which the concave portions 52 of the gear 50 are opposite to the magnet 30, that is, the projection portions 51 of the gear 50 are not opposite thereto alternatively appear.

Then, the direction of the vector of the magnetic field K is changed to be taken to the projection portions 51 of the gear 50.

That is, the magnetic field K of the magnet 30, which is substantially parallel to the Y axis direction at the center portion of the element 20 at an initial stage that the gear 50 is at a standstill, namely, the angle θ between the direction of the vector of the magnetic field K and the X axis becomes substantially 90°, pivotally changes in the range of region A shown in FIG. 1 with respect to the Y axis (θ=90°) in the plane parallel to the X-Y plane so that the angle θ between the vector of the magnetic field K and the X axis changes.

The change of the angle θ between the magnetic vector of the magnetic field K and the X axis makes change the tunneling current of the TMR sensor 10 so that obtaining the number of changes of the tunneling current of the TMR sensor 10 allows the number of revolutions of the gear 50 to be detected.

According to the modification, similar to the first embodiment, using the range of region A shown in FIG. 1 in which the magnetoresistance rapidly changes allows the magnetoresistance to be detected at high sensitivity so that it is possible to provide the revolution detecting device S1a having the TMR sensor 10 with a high MR ratio and capable of efficiently detecting a change of sensitivity of the TMR sensor 10.

(Second embodiment)

Figure 7:
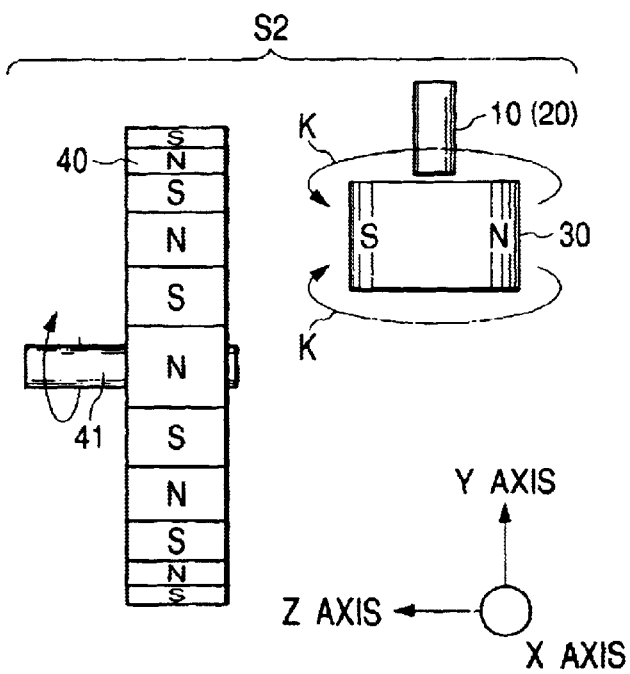
FIG. 7 is a view showing a structure of a revolution detecting device according to a second embodiment of the invention.

FIG. 7 is a view showing a structure of a revolution detecting device S2 according to a second embodiment of the invention. In the second embodiment, different points of the revolution detecting device S2 with respect to the revolution detecting device S1 according to the first embodiment are mainly explained and as other points which are the same of the revolution detecting device S1, descriptions are simplified or omitted.

As shown in FIG. 7, the magnetic rotor 40 is disposed in the vicinity of the element 20 of the TMR sensor 10 in the Z direction from the viewpoint of the element 20. The magnet 30 is disposed in the vicinity of the element 20 so that the direction of the magnetic field K generated by the magnet 30 is substantially parallel to the Z axis at the center portion of the element 20.

The magnetic rotor 40 is arranged so that a tangential line of one end of the circumferential side surface of the rotor 40 substantially equals to the Z axis of the element 20 of the TMR sensor 10.

When the magnetic rotor 40 revolves, the S poles and N poles of the magnetic rotor 40 are configured to move substantially in parallel to the X axis on the Z axis of the element 20. That is, assuming that the Z axis extends from the center of the element 20 toward the magnetic rotor 40, on the extent Z axis, the S poles and N poles of the magnetic rotor 40 are configured to move substantially in parallel to the X axis.

That is, the revolution detecting device S2 has a physical relationship between the X, Y and Z axes in the Cartesian coordinate system determined by the element 20 and each of the magnet 30 and the magnetic rotor 40 shown in FIG. 7, which is changed with respect to the physical relationship therebetween shown in FIGS. 4A and 4B.

As shown in FIG. 7, when the magnetic rotor 40 is at a standstill as an initial stage, the magnetic field in the region at which the element 20 is located corresponds to the magnetic field K generated by the magnet 30, and the direction of the vector of the magnetic field K is substantially parallel to the Z axis direction at the center portion of the element 20, that is, as shown in FIG. 2, the angle $\theta$ between the direction of the vector of the magnetic field K and the X axis becomes substantially 90°.

When the magnetic rotor 40 revolves, the S poles and the N poles of the magnetic rotor 40 move on the Z axis of the element 20 in substantially parallel to the X axis so that the movements of the S poles and N poles of the magnetic rotor 40 affect the magnetic field K, causing the direction of the vector of the magnetic field K to pivotally change in the range of region B shown in FIG. 2 with respect to the Z axis ($\theta=90°$) in a plane parallel to the X-Z plane, thereby changing the angle $\theta$ between the direction of the vector of the magnetic field K and the X axis, as shown in FIG. 2.

According to the second embodiment of the invention, using the range of region B shown in FIG. 2 in which the magnetoresistance rapidly changes allows the magnetoresistance to be detected at high sensitivity so that it is possible to provide the revolution detecting device S2 having the TMR sensor 10 with a high MR ratio and capable of efficiently detecting a change of sensitivity of the TMR sensor 10.

Figure 8:
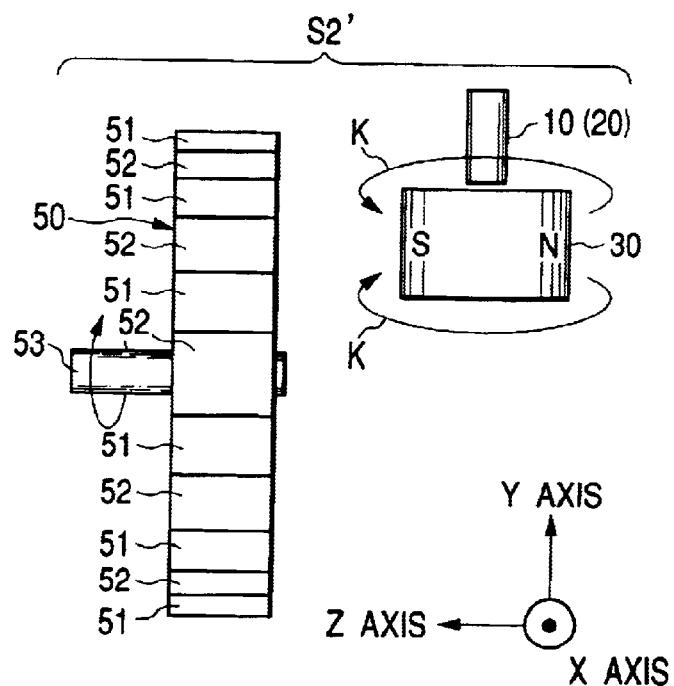
FIG. 8 is a view showing a structure of a revolution detecting device according to a modification of the second embodiment.

Next, a revolution detecting device S2a as a modification of the revolution detecting device S2 according to the second embodiment is shown in FIG. 8. The revolution detecting device S2a according to the modification comprises the discotic gear 50 in place of the magnetic rotor 40, the discotic gear 50 has substantially the same structure shown in FIG. 6.

The gear 50 is disposed in the vicinity of the element 20 of the TMR sensor 10 in the Z direction from the viewpoint of the element 20. The gear shaft 53 rotates with the wheel shaft or the like, making the gear 50 revolve.

The gear 50 is arranged so that a tangential line of one end of the circumferential side surface of the gear 50 substantially equals to the Z axis of the element 20 of the TMR sensor 10.

When the gear 50 revolves, the projection portions 51 and the concave portions 52 of the gear 50 are configured to move substantially in parallel to the X axis on the Z axis of the element 20. That is, assuming that the Z axis extends from the center of the element 20 toward the magnetic rotor 40, on the extent Z axis, the projection portions 51 and the concave portions 52 of the gear 50 are configured to move substantially in parallel to the X axis.

Other elements of the revolution detecting device S2a according to the modification are substantially the same of the revolution detecting device S2 according to the second embodiment.

In the revolution detecting device S2a, when the gear 50 revolves together with the gear shaft 51, the projection portions 51 and the concave portions 52 of the gear 50 move on the Z axis of the element 20 in substantially parallel to the X axis so that the points of time at which the projection portions (teeth) 51 of the gear 50 are opposite to the magnet 30 and the points of time at which the concave portions 52 of the gear 50 are opposite to the magnet 30, that is, the projection portions 51 of the gear 50 are not opposite thereto alternatively appear.

Then, the direction of the vector of the magnetic field K is changed to be taken to the projection portions 51 of the gear 50.

That is, the magnetic field K of the magnet 30, which is substantially parallel to the Z axis direction at the center portion of the element 20 at an initial stage that the gear 50 is at a standstill, namely, the angle $\theta$ between the direction of the vector of the magnetic field K and the X axis becomes substantially 90°, pivotally changes in the range of region B shown in FIG. 2 with respect to the Z axis ($\theta=90°$) in the plane parallel to the X-Z plane so that the angle $\theta$ between the vector of the magnetic field K and the X axis changes.

The change of the angle $\theta$ between the magnetic vector of the magnetic field K and the X axis makes change the tunneling current of the TMR sensor 10 so that obtaining the number of changes of the tunneling current of the TMR sensor 10 allows the number of revolutions of the gear 50 to be detected.

According to the modification, similar to the second embodiment, using the range of region B shown in FIG. 2 in which the magnetoresistance rapidly changes allows the magnetoresistance to be detected at high sensitivity so that it is possible to provide the revolution detecting device S2a having the TMR sensor 10 with a high MR ratio and capable of efficiently detecting a change of sensitivity of the TMR sensor 10.

(Third embodiment)

Figure 9:
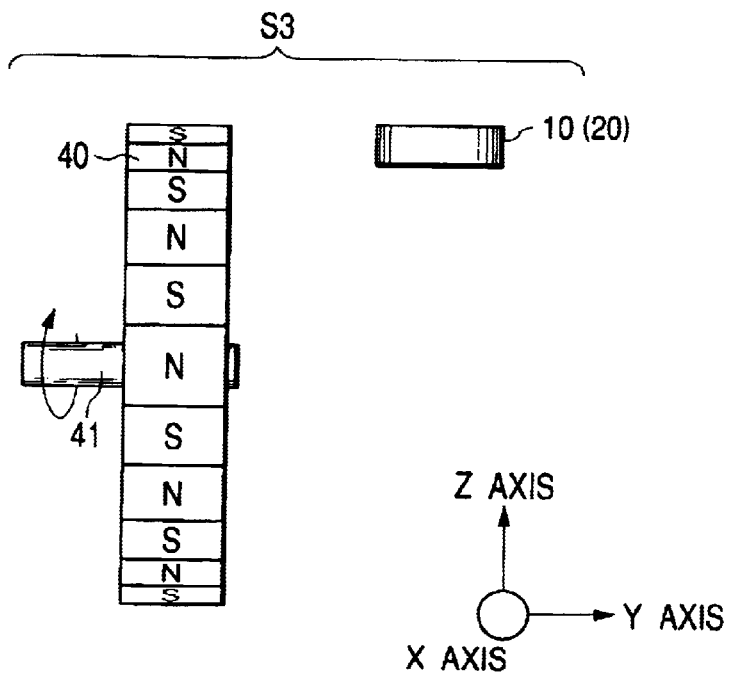
FIG. 9 is a view showing a structure of a revolution detecting device according to a third embodiment of the invention.

FIG. 9 is a view showing a structure of a revolution detecting device S3 according to a third embodiment of the invention. In the third embodiment, the revolution detecting device S3 is modified from the revolution detecting device shown in FIGS. 4A and 4B so that the magnet 30 is omitted. Other elements of the revolution detecting device S3 are the same of the revolution detecting device S1 so that descriptions of other elements are simplified or omitted.

When the magnetic rotor 40 revolves together with the rotor shaft 41, the S poles and the N poles of the magnetic rotor 40 move on the Y axis of the element 20 in substantially parallel to the X axis so that the magnetic field generated by the N poles and S poles of the magnetic rotor 40 revolves in a plane parallel to the X-Y plane.

That is, in the third embodiment, similar to the first embodiment, using the range of region A shown in FIG. 1 in which the magnetoresistance rapidly changes allows the magnetoresistance to be detected at high sensitivity. Therefore, similar to the first embodiment, the change of the angle $\theta$ between the vector of the magnetic field K and the X axis makes change the tunneling current of the TMR sensor 10 so that obtaining the number of changes of the tunneling current of the TMR sensor 10 allows the number of revolutions of the magnetic rotor 40 to be detected.

According to the third embodiment of the invention, using the range of region A shown in FIG. 1 in which the magnetoresistance rapidly changes allows the magnetoresistance to be detected at high sensitivity so that it is possible to provide the revolution detecting device S3 having the TMR sensor 10 with a high MR ratio and capable of efficiently detecting a change of sensitivity of the TMR sensor 10.

(Fourth embodiment)

Figure 10:
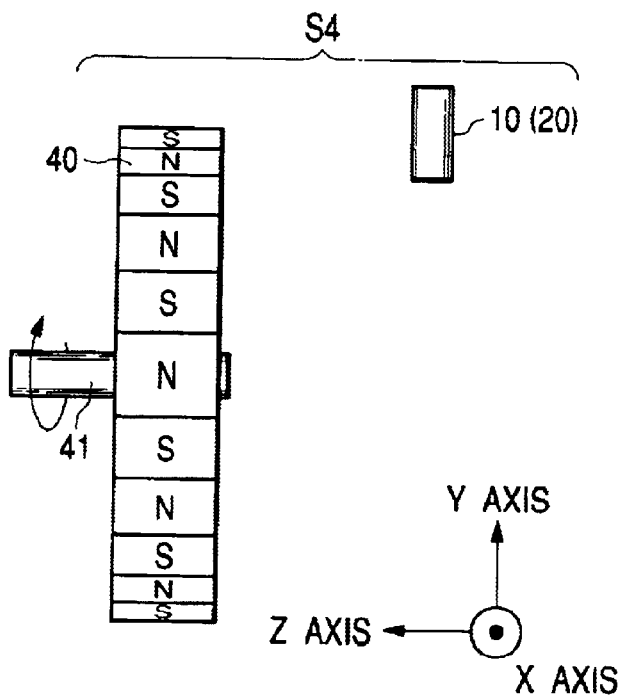
FIG. 10 is a view showing a structure of a revolution detecting device according to a modification of the third embodiment.

FIG. 10 is a view showing a structure of a revolution detecting device S4 according to a fourth embodiment of the invention. In the fourth embodiment, the revolution detecting device S4 is modified from the revolution detecting device shown in FIG. 7 so that the magnet 30 is omitted. Other elements of the revolution detecting device S4 are the same of the revolution detecting device S2 so that descriptions of other elements are simplified or omitted.

When the magnetic rotor 40 revolves together with the rotor shaft 41, the S poles and the N poles of the magnetic rotor 40 move on the Z axis of the element 20 in substantially parallel to the X axis so that the magnetic field generated by the N poles and S poles of the magnetic rotor 40 revolves in a plane parallel to the X-Z plane.

That is, in the third embodiment, similar to the first embodiment, using the range of region B shown in FIG. 2 in which the magnetoresistance rapidly changes allows the magnetoresistance to be detected at high sensitivity. Therefore, similar to the second embodiment, the change of the angle θ between the vector of the magnetic field K and the X axis makes change the tunneling current of the TMR sensor 10 so that obtaining the number of changes of the tunneling current of the TMR sensor 10 with a high MR ratio allows the number of revolutions of the magnetic rotor 40 to be detected.

According to the fourth embodiment of the invention, using the range of region B shown in FIG. 2 in which the magnetoresistance rapidly changes allows the magnetoresistance to be detected at high sensitivity so that it is possible to provide the revolution detecting device S4 having the TMR sensor 10 with a high MR ratio and capable of efficiently detecting a change of sensitivity of the TMR sensor 10.

Then, the structures of the first and second embodiments and those of the third embodiment and the fourth embodiment are difference from each other in presence or absence of the magnet 30. In the first and second embodiments, the magnet 30 is integrated with the element 20 of the TMR sensor 10, allowing the effects to be obtained as follows.

That is, while a magnetic revolution member, such as, the magnetic rotor 40 or the gear 50 is at a standstill as an initial stage, it is possible to securely set the magnetic field K applied to the center portion of the element 20 so that the direction of the vector of the magnetic field K is substantially parallel to the Y axis or the Z axis. To set the direction of the vector of the magnetic field K equals to set the angle θ between the direction of the vector of the magnetic field K and the X axis to 90°. That is, the pivotal movement region of the vector of the magnetic field K is set to a region with respect to the point (direction) on the Y axis or the Z axis at which the detection sensitivity of the element 20 is highest.

In addition, the TMR sensor 10 and the magnet 30 can be integrated with each other by resin or the like so that it is possible to make small the error in setting the magnetic field K.

However, because it is difficult to integrate the sensor 10 with the rotor 40 or 50, the error in disposing the sensor 10 and the rotor 40 or 50 in the revolution detecting device 1 may be relatively large so that the pivotal movement region of the vector of the magnetic field K may be deviated from the region with respect to the point (direction) on the Y axis or the Z axis at which the detection sensitivity of the element 20 is highest.

Therefore, it is preferable for the revolution detecting device to have the magnet 30 in view of efficiently detecting a change of the sensitivity of the TMR element.

(Modification)

In the first and second embodiments, the TMR sensor 10 and the magnet 30 are opposite to the one of the first and second circular surfaces of the magnetic rotor 40, but the present invention is not limited to the structure.

Figure 11:
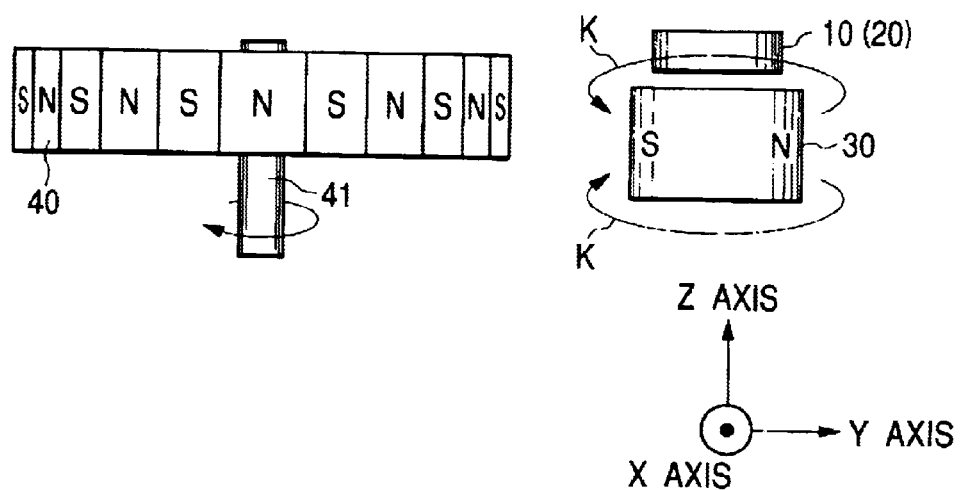
FIG. 11 is a structure of one example of a revolution detecting device according to a modification of the invention.

That is, as shown in FIG. 11, the TMR sensor 10 and the magnet 30 may be arranged so that they are opposite to the circumferential side surface of the rotor 40 and the one of the first and second circular surfaces of the rotor 40 is located substantially along the Y axis of the element 20 of the TMR sensor 10.

Figure 12:
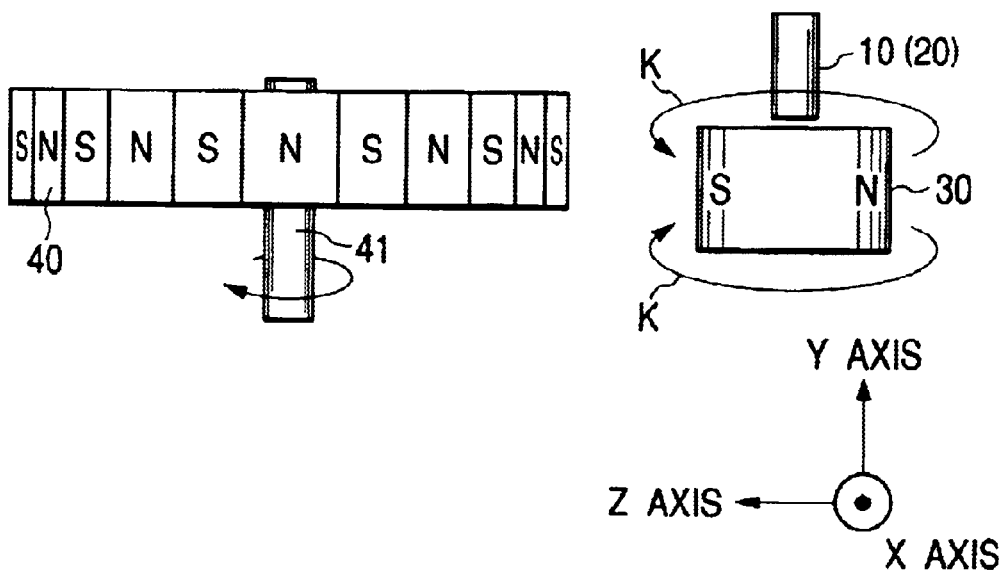
FIG. 12 is a structure of another example of a revolution detecting device according to a modification of the invention.

In addition, as shown in FIG. 12, the TMR sensor 10 and the magnet 30 may be arranged so that they are opposite to the circumferential side surface of the rotor 40 and the one of the first and second circular surfaces of the rotor 40 is located substantially along to the Z axis of the element 20 of the TMR sensor 10.

In each of the structures shown in FIGS. 11 and 12, the rotor 40 may be replaced with the gear 50.

In each of the first to fourth embodiments and modifications, the number of revolutions of the revolution member such as the magnetic rotor or the gear is detected by each of the revolution detecting devices, but the present invention is not limited to the structure.

That is, each of the revolution detecting devices according to each of the first to fourth embodiments and modifications may detect physical values related to the revolutions of the revolution member, such as revolutions of the revolution member per minute (second), revolution angle thereof or the like.

While there has been described what is at present considered to be the preferred embodiments and modifications of the present invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2002-13996 filed on Jan. 23, 2002 so that the contents of which are incorporated herein by reference.

What is claimed is:

1. A revolution detecting device comprising:
   a tunneling magnetoresistance sensor having an element located in a region, said element comprising:
      a substrate;
      a pinned layer composed of ferromagnetism material and located to one side of the substrate;
      a tunneling layer composed of insulating film and located to one side of the pinned layer; and
      a free layer composed of ferromagnetism film and located to one side of the tunneling layer,
      said element being configured to detect a change of magnetoresistance of the element according to a magnetic field applied in the region in which the element is located, said change of the magnetoresistance of the element being based on a change of current flowing through the tunneling layer between the pinned layer and the free layer;
      when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis,
   a revolution member disposed in a vicinity of the element in the Y axis from a viewpoint of the element, said revolution member having a surface portion opposite to the element, said surface portion being formed with S poles and N poles which are alternately arranged; and a magnet disposed in a vicinity of the element and generating the magnetic field, a direction of said magnetic field being substantially parallel to the Y axis at a center portion of the element, wherein, when the revolution member revolves, said S poles and N poles are configured to move substantially in parallel to the X axis on the Y axis determined by the element.

2. A revolution detecting device according to claim 1, wherein said revolution member is a discotic magnetic rotor having first and second circular surfaces and a circumferential side surface connected thereto, said surface portion corresponding to one of said first circular surface, second circular surface and circumferential side surface, and wherein said S poles and N poles are formed on one of said first circular surface, second circular surface and circumferential side surface.

3. A revolution detecting device comprising:

a tunneling magnetoresistance sensor having an element located in a region, said element comprising:

a substrate;

a pinned layer composed of ferromagnetism material and located to one side of the substrate;

a tunneling layer composed of insulating film and located to one side of the pinned layer; and a free layer composed of ferromagnetism film and located to one side of the tunneling layer, said element being configured to detect a change of magnetoresistance of the element according to a magnetic field applied in the region in which the element is located, said change of the magnetoresistance of the element being based on a change of current flowing through the tunneling layer between the pinned layer and the free layer;

when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Y axis from a viewpoint of the element, said revolution member having a surface portion opposite to the element, said surface portion being formed with projecting portions and concave portions which are alternately arranged; and a magnet disposed in a vicinity of the element and generating the magnetic field, a direction of said magnetic field being substantially parallel to the Y axis at a center portion of the element, wherein, when the revolution member revolves, said projecting portions and concave portions are configured to move substantially in parallel to the X axis on the Y axis determined by the element.

4. A revolution detecting device according to claim 3, wherein said revolution member is a discotic gear having first and second circular surfaces and a circumferential side surface connected thereto, said surface portion corresponding to one of said first circular surface, second circular surface and circumferential side surface, and wherein said projecting portions and concave portions are formed on the one of said first circular surface, second circular surface and circumferential side surface.

5. A revolution detecting device comprising:

a tunneling magnetoresistance sensor having an element located in a region, said element comprising:

a substrate;

a pinned layer composed of ferromagnetism material and located to one side of the substrate;

a tunneling layer composed of insulating film and located to one side of the pinned layer; and a free layer composed of ferromagnetism film and located to one side of the tunneling layer, said element being configured to detect a change of magnetoresistance of the element according to a magnetic field applied in the region in which the element is located, said change of the magnetoresistance of the element being based on a change of current flowing through the tunneling layer between the pinned layer and the free layer;

when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Z axis from a viewpoint of the element, said revolution member having a surface portion opposite to the element, said surface portion being formed with S poles and N poles which are alternately arranged; and a magnet disposed in a vicinity of the element and generating the magnetic field, a direction of said magnetic field being substantially parallel to the Z axis at a center portion of the element, wherein, when the revolution member revolves, said S poles and N poles are configured to move substantially in parallel to the X axis on the Z axis determined by the element.

6. A revolution detecting device according to claim 5, wherein said revolution member is a discotic magnetic rotor having first and second circular surfaces and a circumferential side surface connected thereto, said surface portion corresponding to one of said first circular surface, second circular surface and circumferential side surface, and wherein said S poles and N poles are formed on one of said first circular surface, second circular surface and circumferential side surface.

7. A revolution detecting device comprising:

a tunneling magnetoresistance sensor having an element located in a region, said element comprising:

a substrate;

a pinned layer composed of ferromagnetism material and located to one side of the substrate;

a tunneling layer composed of insulating film and located to one side of the pinned layer; and a free layer composed of ferromagnetism film and located to one side of the tunneling layer, said element being configured to detect a change of magnetoresistance of the element according to a magnetic field applied in the region in which the element is located, said change of the magnetoresistance of the element being based on a change of current flowing through the tunneling layer between the pinned layer and the free layer;

when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Z axis from a viewpoint of the element, said revolution member having a surface portion opposite to the element, said surface portion being formed with projecting portions and concave portions which are alternately arranged; and a magnet disposed in a vicinity of the element and generating the magnetic field, a direction of said magnetic field being substantially parallel to the Z axis at a center portion of the element, wherein, when the revolution member revolves, said projecting portions and concave portions are configured to move substantially in parallel to the X axis on the Z axis determined by the element.

8. A revolution detecting device according to claim 7, wherein said revolution member is a discotic gear having first and second circular surfaces and a circumferential side surface connected thereto, said surface portion corresponding to one of said first circular surface, second circular surface and circumferential side surface, and wherein said projecting portions and concave portions are formed on the one of said first circular surface, second circular surface and circumferential side surface.

9. A revolution detecting device comprising:

a tunneling magnetoresistance sensor having an element located in a region, said element comprising:

a substrate;

a pinned layer composed of ferromagnetism material and located to one side of the substrate;

a tunneling layer composed of insulating film and located to one side of the pinned layer; and a free layer composed of ferromagnetism film and located to one side of the tunneling layer, said element being configured to detect a change of magnetoresistance of the element according to a magnetic field applied in the region in which the element is located, said change of the magnetoresistance of the element being based on a change of current flowing through the tunneling layer between the pinned layer and the free layer; and when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Y axis from a viewpoint of the element, said revolution member having a surface portion opposite to the element, said surface portion being formed with S poles and N poles which are alternately arranged, wherein, when the revolution member revolves, said S poles and N poles are configured to move substantially in parallel to the X axis on the Y axis determined by the element.

10. A revolution detecting device according to claim 9, wherein said revolution member is a discotic magnetic rotor having first and second circular surfaces and a circumferential side surface connected thereto, said surface portion corresponding to one of said first circular surface, second circular surface and circumferential side surface, and wherein said S poles and N poles are formed on one of said first circular surface, second circular surface and circumferential side surface.

11. A revolution detecting device comprising:

a tunneling magnetoresistance sensor having an element located in a region, said element comprising:

a substrate;

a pinned layer composed of ferromagnetism material and located to one side of the substrate;

a tunneling layer composed of insulating film and located to one side of the pinned layer; and a free layer composed of ferromagnetism film and located to one side of the tunneling layer, said element being configured to detect a change of magnetoresistance of the element according to a magnetic field applied to the element, said change of the magnetoresistance of the element being based on a change of current flowing through the tunneling layer between the pinned layer and the free layer; and when determining Cartesian coordinate system such that a center of the free layer is taken as an origin, a magnetization direction of the pinned layer passing through the origin is taken as an X axis, a direction passing through the origin and orthogonal to the X axis and a layer plane of the pinned layer is taken as a Z axis and a direction passing through the origin and orthogonal to an X-Z plane including the X axis and the Z axis is taken as the Y axis, a revolution member disposed in a vicinity of the element in the Z axis from a viewpoint of the element, said revolution member having a surface portion opposite to the element, said surface portion being formed with S poles and N poles which are alternately arranged, wherein, when the revolution member revolves, said S poles and N poles are configured to move substantially in parallel to the X axis on the Z axis determined by the element.

12. A revolution detecting device according to claim 11, wherein said revolution member is a discotic magnetic rotor having first and second circular surfaces and a circumferential side surface connected thereto, said surface portion corresponding to one of said first circular surface, second circular surface and circumferential side surface, and wherein said S poles and N poles are formed on one of said first circular surface, second circular surface and circumferential side surface.

* * * * *